(12) United States Patent
Takahashi

(10) Patent No.: US 11,764,039 B2
(45) Date of Patent: Sep. 19, 2023

(54) WAFER SUPPORT

(71) Applicant: NGK INSULATORS, LTD., Nagoya (JP)

(72) Inventor: Tomohiro Takahashi, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 775 days.

(21) Appl. No.: 16/751,742

(22) Filed: Jan. 24, 2020

(65) Prior Publication Data

US 2020/0161106 A1    May 21, 2020

Related U.S. Application Data

(63) Continuation of application No. PCT/JP2019/024033, filed on Jun. 18, 2019.

(30) Foreign Application Priority Data

Jul. 4, 2018 (JP) .................................. 2018-127620

(51) Int. Cl.
*H01J 37/32* (2006.01)
*B32B 18/00* (2006.01)
*H01L 21/67* (2006.01)
*H01L 21/687* (2006.01)

(52) U.S. Cl.
CPC ........ *H01J 37/32724* (2013.01); *B32B 18/00* (2013.01); *H01J 37/32541* (2013.01);
(Continued)

(58) Field of Classification Search
CPC ................ C04B 37/006; C04B 37/001; C04B 2237/343; C04B 2237/765;
(Continued)

(56) References Cited

U.S. PATENT DOCUMENTS

| 6,558,508 | B1 * | 5/2003 | Kawakami | ........ H01L 21/67103 |
| | | | | 118/728 |
| 2011/0096461 | A1 | 4/2011 | Yoshikawa et al. | |
| 2016/0225652 | A1 * | 8/2016 | Tran | .................... H01L 21/3065 |
| 2019/0088517 | A1 | 3/2019 | Kosakai et al. | |

FOREIGN PATENT DOCUMENTS

| JP | H07-086251 A1 | 3/1995 |
| JP | 2005-018992 A1 | 1/2005 |

(Continued)

OTHER PUBLICATIONS

English translation of the International Preliminary Report on Patentability (Chapter I) (Application No. PCT/JP2019/024033) dated Jan. 14, 2021.

(Continued)

*Primary Examiner* — Yuechuan Yu
(74) *Attorney, Agent, or Firm* — BURR PATENT LAW, PLLC

(57) ABSTRACT

A wafer support includes an RF electrode and a heater electrode that are embedded inside a disk-shaped ceramic base having a wafer placement surface. The RF electrode is constituted by a plurality of RF zone electrodes that are individually disposed for each of a plurality of divided zones of the wafer placement surface. The plurality of RF zone electrodes are separately disposed in at least two stages that are positioned at different distances from the wafer placement surface. The heater electrode is constituted by a plurality of heater zone electrodes that are individually disposed for each of a plurality of divided zones of the wafer placement surface, the zones being divided in a similar or different way to or from the RF zone electrodes.

8 Claims, 12 Drawing Sheets

(52) U.S. Cl.
CPC .. *H01J 37/32568* (2013.01); *H01J 37/32577* (2013.01); *H01L 21/67248* (2013.01); *H01L 21/68757* (2013.01); *H01L 21/68785* (2013.01)

(58) Field of Classification Search
CPC .......... C04B 2237/366; C04B 2237/80; H01L 21/67248; H01L 21/68757; H01L 21/68735; H01L 21/67103; H01L 21/68785; H01L 21/68792; B32B 18/00; H01J 37/32724; H01J 37/32568; H01J 37/32577; H01J 37/32541
See application file for complete search history.

(56) References Cited

FOREIGN PATENT DOCUMENTS

| | | | |
|---|---|---|---|
| JP | 2011-119654 A1 | | 6/2011 |
| JP | 2012-089694 A1 | | 5/2012 |
| JP | 2012089694 A | * | 5/2012 |
| JP | 5896595 B2 | | 3/2016 |
| WO | 2016/080502 A1 | | 5/2016 |

OTHER PUBLICATIONS

International Search Report and Written Opinion (Application No. PCT/JP2019/024033) dated Aug. 20, 2019.

* cited by examiner

WAFER SUPPORT

BACKGROUND OF THE INVENTION

1. Field of the Invention

The present invention relates to a wafer support.

2. Description of the Related Art

In a known wafer support, an RF electrode and a heater electrode are embedded inside a disk-shaped ceramic base having a wafer placement surface in the mentioned order from the side closer to the wafer placement surface. The above-type wafer support disclosed in Patent Literature (PTL) 1, for example, includes a circular RF electrode and an annular RF electrode that are embedded inside the ceramic base at different depths from the wafer placement surface. A flat-plate upper electrode is disposed at a position opposing to the wafer placement surface of the wafer support. Plasma is generated by applying radio frequency power between a parallel-plate electrode constituted by the flat-plate upper electrode and each of the RF electrodes in the wafer support. PTL 1 states that a density distribution of plasma can be satisfactorily controlled by applying different radio frequency powers to the circular RF electrode and the annular RF electrode when the plasma is generated.

CITATION LIST

Patent Literature

PTL 1: Japanese Patent No. 5896595

SUMMARY OF THE INVENTION

However, when the plasma is generated, a distance between the flat-plate upper electrode and the circular RF electrode is different from that between the flat-plate upper electrode and the annular RF electrode, and a thickness of a dielectric layer (ceramic base) between the wafer placement surface and the circular RF electrode is also different from that between the wafer placement surface and the annular RF electrode. Therefore, density of the plasma becomes non-uniform in some cases.

The present invention has been made with intent to solve the above-described problem, and a main object of the present invention is to suppress generation of trouble caused by non-uniform density of plasma.

To achieve at least one of the objects, a wafer support according to the present invention is constituted as follows.

The present invention provides a wafer support including an RF electrode and a heater electrode that are embedded inside a disk-shaped ceramic base having a wafer placement surface, wherein the RF electrode is constituted by a plurality of RF zone electrodes that are individually disposed for each of a plurality of divided zones of the wafer placement surface, the plurality of RF zone electrodes are separately disposed in at least two stages that are positioned at different distances from the wafer placement surface, the heater electrode is constituted by a plurality of heater zone electrodes that are individually disposed for each of a plurality of divided zones of the wafer placement surface, the zones being divided in a similar or different way to or from the RF zone electrodes, the plurality of RF zone electrodes are independently connected to a plurality of RF zone electrode conductors through electrode terminals disposed on a rear surface of the ceramic base, and the plurality of heater zone electrodes are independently connected to a plurality of heater zone electrode conductors through electrode terminals disposed on the rear surface of the ceramic base.

In the above-described wafer support, the plurality of RF zone electrodes and the plurality of heater zone electrodes are independently connected to the plurality of RF zone electrode conductors and the plurality of heater electrode conductors, respectively, through the electrode terminals disposed on the surface (rear surface) of the ceramic base on the side opposite to the wafer placement surface. Therefore, different radio frequency powers can be supplied to the individual RF zone electrodes, and a density of plasma generated above a wafer placed on the wafer placement surface can be made uniform with certain accuracy. On the other hand, because the plurality of RF zone electrodes are separately disposed in at least two stages, the plasma density becomes non-uniform in some cases. Nevertheless, since the different powers can be individually supplied to the heater zone electrodes, variations in performance of film formation between the different zones can be compensated and adjusted by controlling heater temperatures. Accordingly, it is possible to suppress generation of trouble caused by the non-uniform density of the plasma.

In the wafer support according to the present invention, the RF electrode may include, as the plurality of RF zone electrodes, a circular electrode concentric to the ceramic base or a plurality of divided electrodes of the circular electrode, and may further include, outside the circular electrode or the plurality of divided electrodes of the circular electrode, one or more annular electrodes concentric to the ceramic base or a plurality of divided electrodes of at least one of the annular electrodes. Because a density distribution of the plasma is different between an inner peripheral portion and an outer peripheral portion of the ceramic base in many cases, the RF zone electrodes are preferably separated, as described above, into the circular electrode (or the plurality of divided electrodes of the circular electrode) and the one or more annular electrodes (or the plurality of divided electrodes of the annular electrode). For example, the RF zone electrodes may be constituted by the circular electrode concentric to the ceramic base and the one or more annular electrodes disposed outside the circular electrode and concentric to the ceramic base. In another example, the RF zone electrodes may be constituted by a pair of semicircular electrodes formed by dividing the circular electrode concentric to the ceramic base and the one or more annular electrodes disposed outside both the semicircular electrodes and concentric to the ceramic base. In still another example, the annular electrode may be divided into a plurality of electrodes.

In the wafer support according to the present invention, at least one of the heater zone electrodes may be arranged in a gap between the RF zone electrodes when the ceramic base is viewed from the side facing the wafer placement surface. In the case of applying larger RF power, increasing a size of the gap is advantageous in that RF interference can be suppressed, but the larger size gap may cause a phenomenon that the plasma density reduces in a gap region where the RF electrodes are not present and that the in-plane plasma density becomes non-uniform. Thus, with the arrangement in which the heater zone electrode is disposed in the gap region, an advantageous effect is obtained in that variations in performance of film formation attributable to the non-uniform density of the plasma can be compensated and adjusted by controlling a temperature distribution, i.e., heater temperatures. In the above-described wafer support, the heater zone electrode arranged in the gap may be a gap heater zone electrode having a shape corresponding to the gap. In such a case, since it is easier to separately control a temperature in the gap by the gap heater zone electrode, variations in performance of film formation near the gap can be compensated and adjusted by controlling a temperature of the gap heater zone electrode.

In the wafer support according to the present invention, shapes of the plurality of RF zone electrodes and shapes of the plurality of heater zone electrodes may be in match with each other when the ceramic base is viewed from the side facing the wafer placement surface. In such a case, temperatures of the RF zone electrodes can be individually controlled by the corresponding heater zone electrodes. When the heater zone electrode is constituted by a coil, for example, the "shape of the heater zone electrode" implies the shape of a region where the coil is laid.

In the wafer support according the present invention, the plurality of RF zone electrodes may include a circular electrode concentric to the ceramic base and one or more annular electrodes concentric to the ceramic base, the annular electrodes being positioned outside the circular electrode, the plurality of heater zone electrodes constituting the heater electrode may be disposed on the same plane, and heights of the plurality of RF zone electrodes from the heater electrode may be set such that the height of the RF zone electrode positioned closer to a center of the ceramic base is higher (or lower). In such a case, thicknesses of the ceramic base in regions above the RF zone electrodes (namely, thicknesses of dielectric layers in those regions) may be equal to each other.

The wafer support according to the present invention may further include a hollow ceramic shaft bonded to a central region of a surface of the ceramic base on the side opposite to the wafer placement surface, and the RF zone electrode conductors and the heater electrode conductors may be disposed inside the ceramic shaft.

In the wafer support according the present invention, the plurality of RF zone electrodes may be disposed in multiple stages such that distances from the wafer placement surface to all the RF zone electrodes are different. As an alternative, even with the plurality of RF zone electrodes disposed in multiple stages, two or more of the RF zone electrodes may be disposed in the same stage. The plurality of heater zone electrodes may be disposed on the same plane, or may be disposed such that distances from the wafer placement surface to the heater zone electrodes are different. It is to be noted that the shape and number of the RF zone electrodes and the shape and number of the heater zone electrodes can be determined optionally.

DETAILED DESCRIPTION OF THE INVENTION

Figure 1:
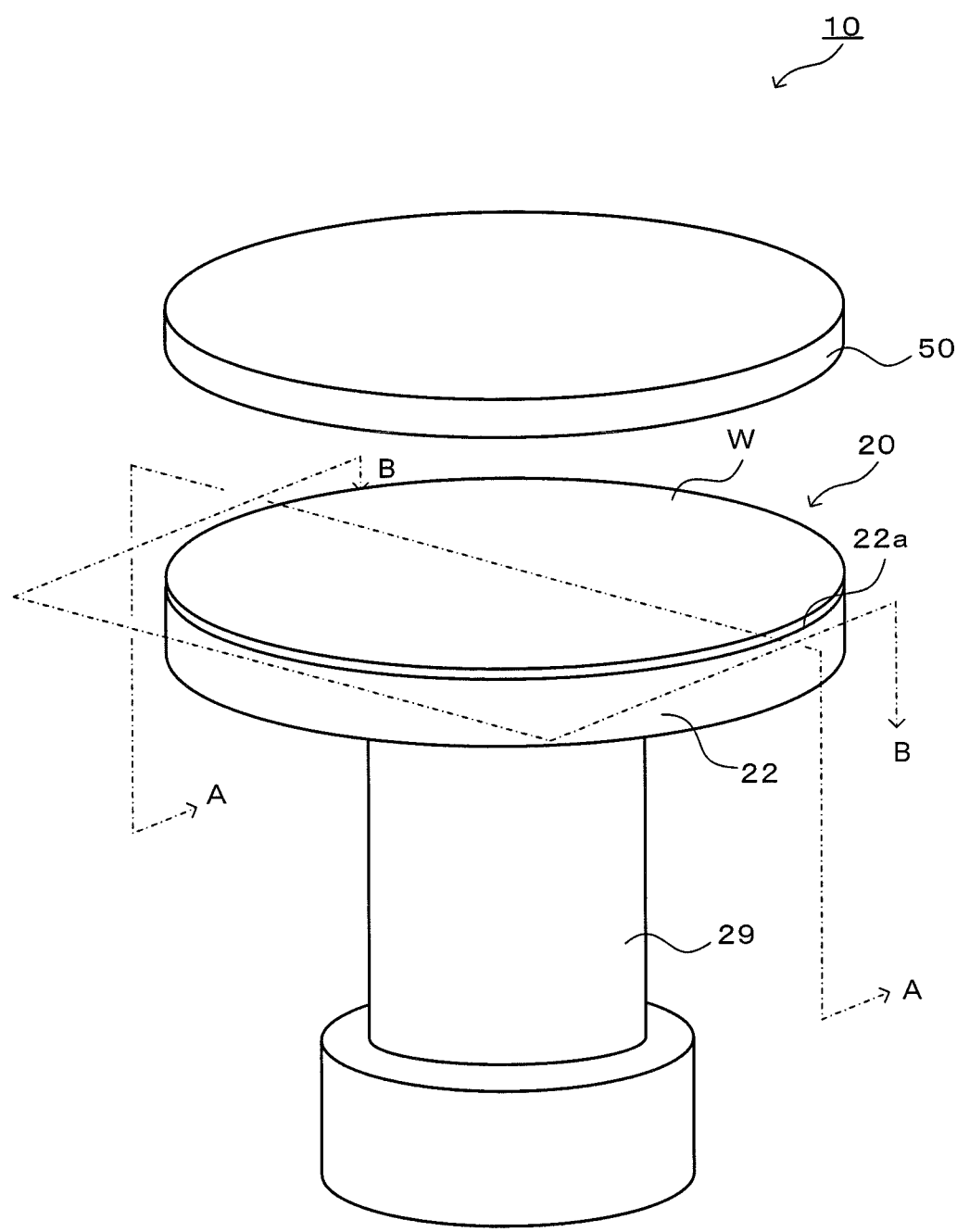
FIG. 1 is a perspective view schematically illustrating a structure of a plasma generator 10.
Figure 2:
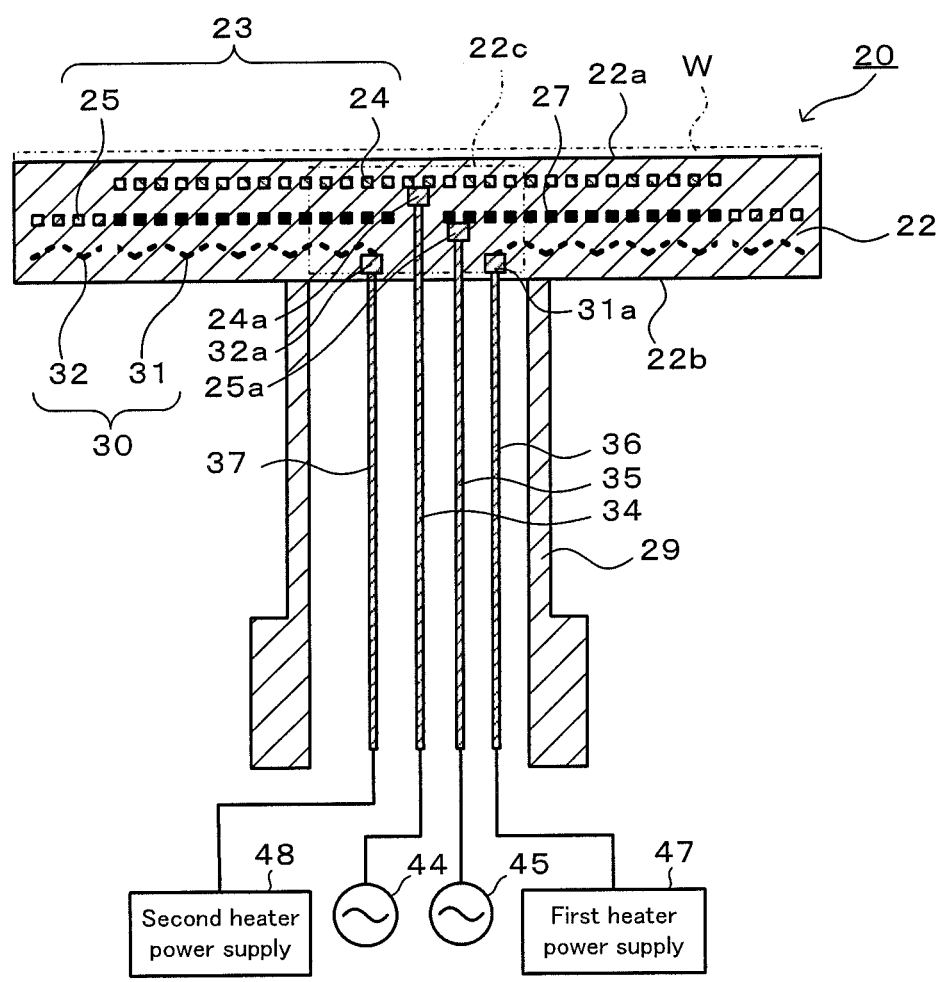
FIG. 2 is a sectional view taken along A-A in FIG. 1.
Figure 3:
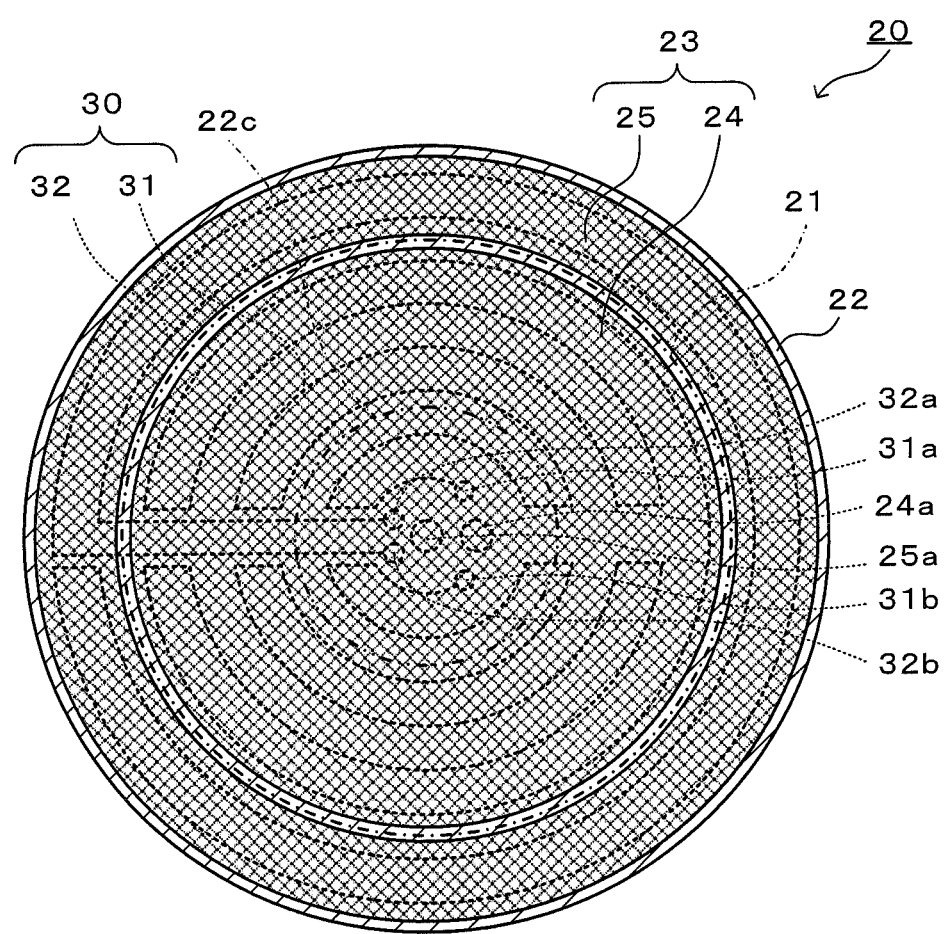
FIG. 3 is a sectional view taken along B-B in FIG. 1.
Figure 4:
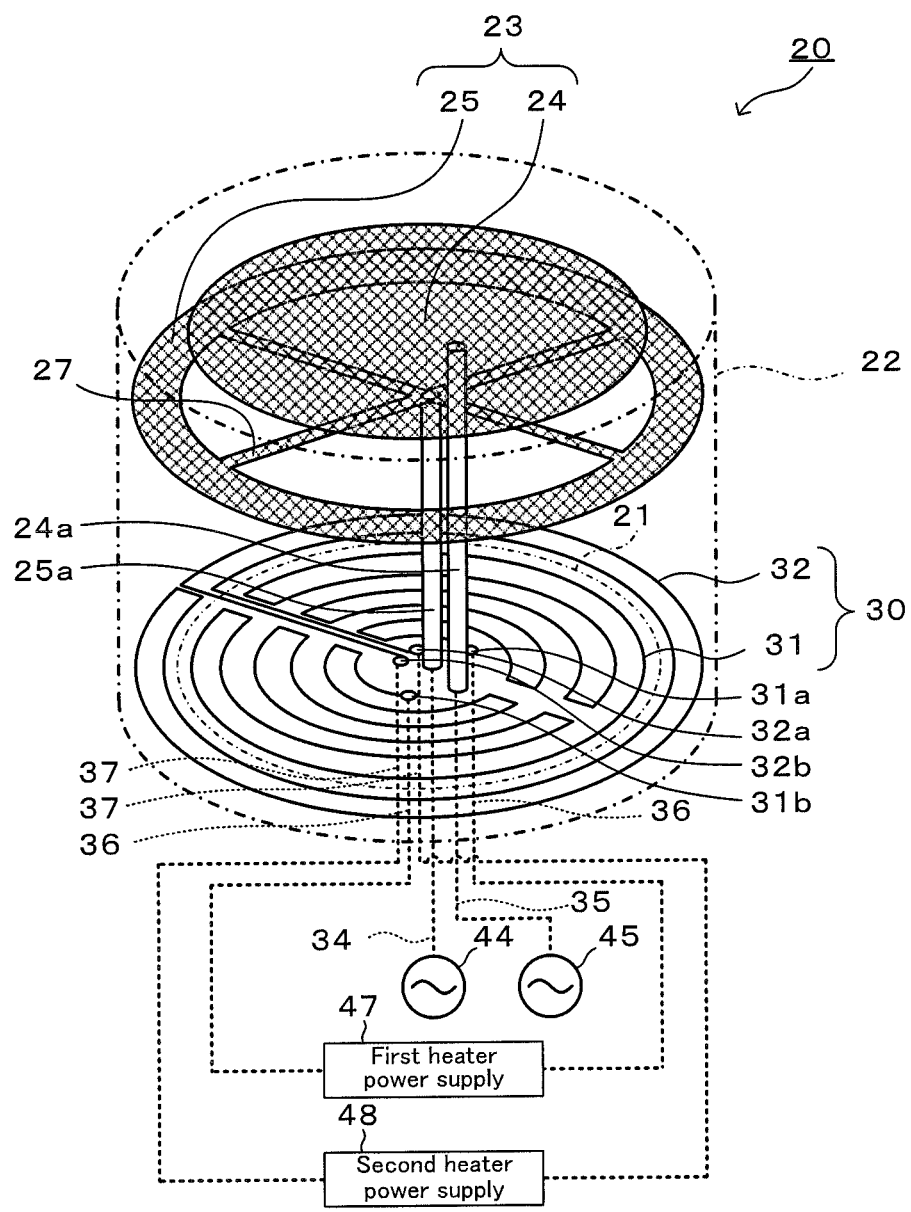
FIG. 4 is a perspective view illustrating an arrangement of an RF electrode 23 and a heater electrode 30.

A preferred embodiment of the present invention will be described below with reference to the drawings. FIG. 1 is a perspective view of the plasma generator 10. FIG. 2 is a sectional view taken along A-A in FIG. 1, and FIG. 3 is a sectional view taken along B-B in FIG. 1. FIG. 4 is a perspective view illustrating an arrangement of an RF electrode 23 and a heater electrode 30.

As illustrated in FIG. 1, the plasma generator 10 includes a wafer support 20 and an upper electrode 50.

The wafer support 20 is used to support and heat a wafer W on which CVD, etching, etc. are performed with the aid of plasma, and it is mounted inside a not-illustrated chamber for a semiconductor process. The wafer support 20 includes a ceramic base 22 and a hollow ceramic shaft 29.

As illustrated in FIG. 2, the ceramic base 22 is a disk-shaped member made of ceramic (alumina or aluminum nitride). A front surface of the ceramic base 22 serves as a wafer placement surface 22a on which the wafer W can be placed. The ceramic shaft 29 is bonded to a central region of a surface (rear surface) 22b of the ceramic base 22 on the side opposite to the wafer placement surface 22a. As illustrated in FIGS. 2 to 4, the RF electrode 23 and the heater electrode 30 are embedded inside the ceramic base 22. The RF electrode 23 and the heater electrode 30 are embedded in the mentioned order from the side closer to the wafer placement surface 22a.

The RF electrode 23 is disposed parallel (including the substantially parallel case; this is similarly applied to the following description) to the wafer placement surface 22a. The RF electrode 23 includes a first RF zone electrode 24 disposed in a zone inside a circle 21 (see FIG. 3) having a predetermined radius (that is, for example, not less than half the radius of the ceramic base 22) about the center of the ceramic base 22, and a second RF zone electrode 25 disposed in a zone outside the circle 21. In other words, the first and second RF zone electrodes 24 and 25 are individually disposed for each of a plurality of divided zones of the wafer placement surface 22a. The first RF zone electrode 24 is a circular electrode concentric to the ceramic base 22. The second RF zone electrode 25 is an annular electrode concentric to the ceramic base 22 and apart from the first RF zone electrode 24. The first and second RF zone electrodes 24 and 25 are embedded at different heights (at positions of different distances from the wafer placement surface 22a) inside the ceramic base 22. Here, the first RF zone electrode 24 is positioned closer to the wafer placement surface 22a. The first RF zone electrode 24 is disposed in an overlapping relation to a circular central region 22c (denoted by a two-dot-chain line in FIGS. 2 and 3) that is defined by projecting the ceramic shaft 29 to the ceramic base 22, while the second RF zone electrode 25 is disposed in a position away from the central region 22c. The first and second RF zone electrodes 24 and 25 are each formed of a conductive mesh sheet.

As illustrated in FIG. 2, an electrode terminal 24a is connected to the first RF zone electrode 24 substantially at the center of its rear surface. The electrode terminal 24a is disposed to be exposed to the outside from the rear surface 22b of the ceramic base 22. The first RF zone electrode 24 is connected to a first RF zone electrode conductor 34 through the electrode terminal 24a. The first RF zone electrode conductor 34 is connected to a first AC power supply 44 through a hollow interior and a lower opening of the ceramic shaft 29.

As illustrated in FIGS. 2 and 4, the second RF zone electrode 25 includes a connection conductor 27 formed of a conductive mesh sheet. The connection conductor 27 is disposed to radially extend from the center of the annular second RF zone electrode 25 and is arranged to be out of interference with the electrode terminal 24a. An electrode terminal 25a is disposed to be exposed to the outside from the rear surface 22b of the ceramic base 22. The electrode terminal 25a is disposed on the connection conductor 27 and is also arranged to be out of interference with the electrode terminal 24a. The second RF zone electrode 25 is connected to a second RF zone electrode conductor 35 through the connection conductor 27 and the electrode terminal 25a. The second RF zone electrode conductor 35 is connected to a second AC power supply 45 through the hollow interior and the lower opening of the ceramic shaft 29.

The heater electrode 30 is disposed parallel to the wafer placement surface 22a. The heater electrode 30 is constituted by a first heater zone electrode 31 disposed in a zone inside the above-mentioned circle 21 (see FIG. 3), and a second heater zone electrode 32 disposed in a zone outside the circle 21. In other words, as in the first and second RF zone electrodes 24 and 25, the first and second heater zone electrodes 31 and 32 are individually disposed for each of two divided zones of the wafer placement surface 22a. The first heater zone electrode 31 and the second heater zone electrode 32 are embedded inside the ceramic base 22 in a spaced relation at the same height (namely, on the same plane).

The first heater zone electrode 31 has two electrode terminals 31a and 31b, and it is formed by wiring a coil over an entire circular region inside the circle 21 in a one-stroke pattern from one electrode terminal 31a to the other electrode terminal 31b. The electrode terminals 31a and 31b are connected to a first heater power supply 47 through individual first heater zone electrode conductors 36 and 36. For convenience, FIG. 2 illustrates only the one electrode terminal 31a. The first heater zone electrode 31 is disposed in an overlapping relation to the first RF zone electrode 24 when viewed in plan.

The second heater zone electrode 32 has two electrode terminals 32a and 32b, and it is formed by wiring a coil over an entire annular region outside the circle 21 in a one-stroke pattern from one electrode terminal 32a to the other electrode terminal 32b. The electrode terminals 32a and 32b are connected to a second heater power supply 48 through individual second heater zone electrode conductors 37 and 37. For convenience, FIG. 2 illustrates only the one electrode terminal 32a. The second heater zone electrode 32 is disposed in an overlapping relation to the second RF zone electrode 25 when viewed in plan.

Materials of the RF electrode 23, the connection conductor 27, and the heater electrode 30 may be the same or different from one another. The materials are not limited to particular one or more insofar as having electrical conductivity. Examples of the materials include Mo, W, Nb, a Mo compound, a W compound, and a Nb compound. Among those examples, the material having a smaller difference in coefficient of thermal expansion in comparison with a material of the ceramic base 22 is preferable.

The ceramic shaft 29 is a cylindrical member made of the same ceramic as the ceramic base 22. An upper end surface of the ceramic shaft 29 is bonded to the rear surface 22b of the ceramic base 22 by diffusion bonding or TCB (Thermal compression bonding). TCB stands for a known method of holding a metal bonding material between two members as bonding objects, and bonding those two members under pressure in a state in which they are heated to a temperature below the solidus temperature of the metal bonding material.

As illustrated in FIG. 1, the upper electrode 50 is fixed at an upper position (e.g., a ceiling surface of a not-illustrated chamber) opposing to the wafer placement surface 22a of the ceramic base 22. The upper electrode 50 is connected to a ground.

An example of use of the plasma generator 10 will be described below. The plasma generator 10 is arranged in the not-illustrated chamber, and the wafer W is placed on the wafer placement surface 22a. The radio frequency power is supplied to the first RF zone electrode 24 from the first AC power supply 44, and the radio frequency power is supplied to the second RF zone electrode 25 from the second AC power supply 45. As a result, plasma is generated between a parallel-plate electrode constituted by the upper electrode 50 and the RF electrode 23 embedded in the ceramic base 22, and CVD film formation or etching is carried out on the wafer W by utilizing the plasma. Furthermore, a temperature of the wafer W is determined in accordance with a detection signal from a not-illustrated thermocouple. A voltage applied to the first heater zone electrode 31 is controlled by the first heater power supply 47 and a voltage applied to the second heater zone electrode 32 is controlled by the second heater power supply 48 such that the temperature of the wafer W is kept at a setting temperature (e.g., 350° C. or 300° C.)

In the wafer support 20 described above in detail, different high frequency powers (e.g., powers having the same frequency, but having different wattages, powers having different frequencies, but having the same wattage, or powers having different frequencies and different wattages) can be individually supplied to the first and second RF zone electrodes 24 and 25, and the density of the plasma above the wafer W placed on the wafer placement surface 22a can be made uniform with certain accuracy. On the other hand, because the first and second RF zone electrodes 24 and 25 are disposed in a multi-stage arrangement, the density of the plasma becomes non-uniform in some cases. Nevertheless, since the different powers can be individually supplied to the first and second heater zone electrodes 31 and 32, variations in performance of film formation between the different zones can be compensated and adjusted by controlling the heater temperatures. Accordingly, it is possible to suppress generation of trouble caused by the non-uniform density of the plasma.

Because the density distribution of the plasma is different between an inner peripheral portion and an outer peripheral portion of the ceramic base 22, the RF electrode 23 is preferably divided, as described above, into the circular electrode (i.e., the first RF zone electrode 24) on the inner peripheral side and the annular electrode (i.e., the second RF zone electrode 25) on the outer peripheral side.

In addition, when looking at the ceramic base 22 from the side facing the wafer placement surface 22a (namely, when viewed in plan), the first and second RF zone electrodes 24 and 25 are disposed in match with the first and second heater zone electrodes 31 and 32, respectively. Therefore, temperatures of the RF zone electrodes 24 and 25 can be individually controlled by the corresponding heater zone electrodes 31 and 32, respectively.

It is needless to say that the present invention is not limited to the above-described embodiment and it can be implemented in various forms insofar as falling within the technical scope of the present invention.

Figure 5:
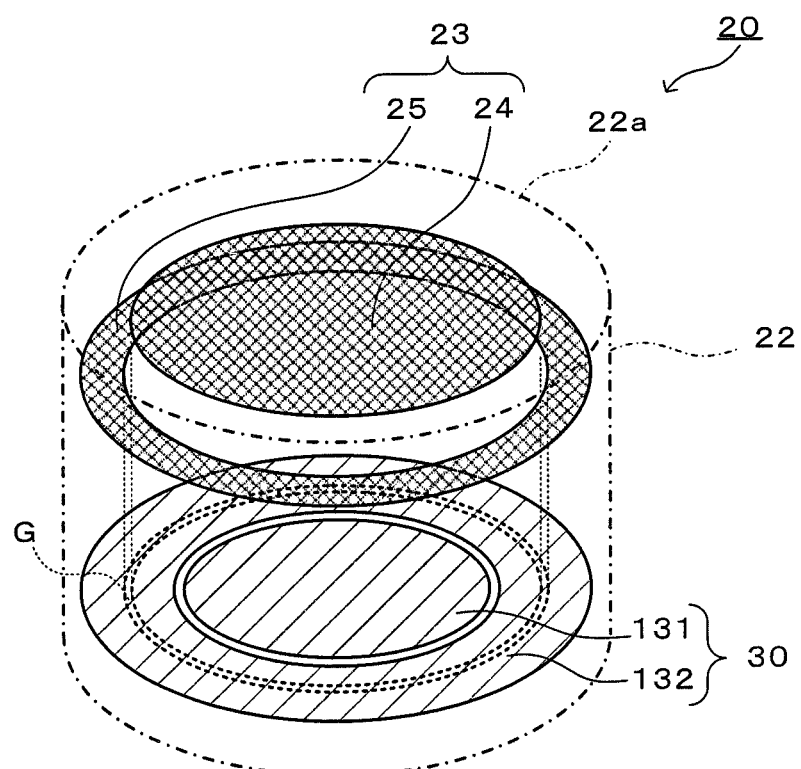
FIG. 5 is a perspective view illustrating another arrangement of the RF electrode 23 and the heater electrode 30.
Figure 6:
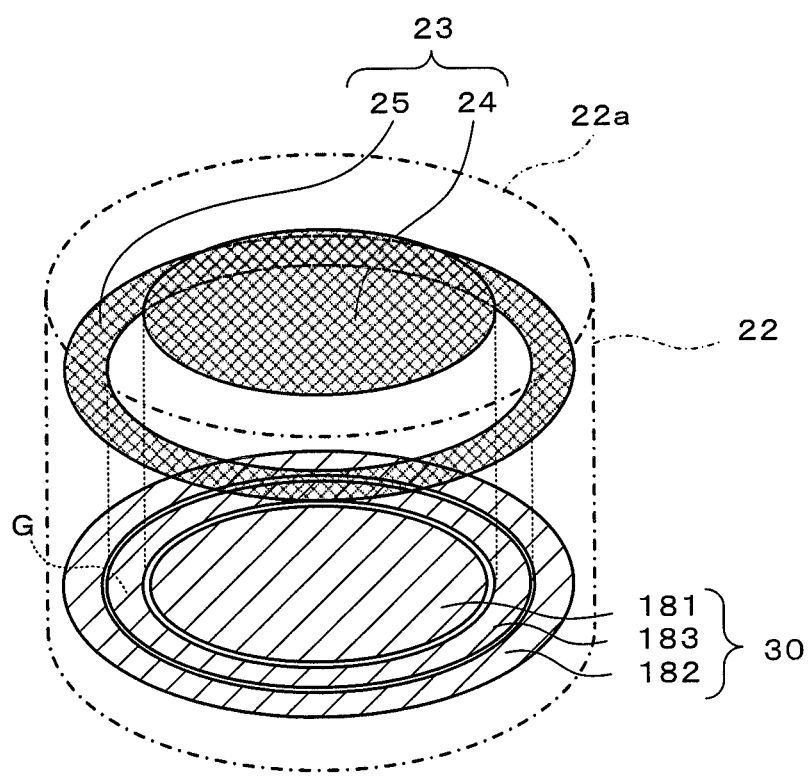
FIG. 6 is a perspective view illustrating still another arrangement of the RF electrode 23 and the heater electrode 30.

For example, while, in the above-described embodiment, the shapes of the first and second RF zone electrodes 24 and 25 and the shapes of the first and second heater zone electrodes 31 and 32 are arranged in match with each other when viewed in plan, those shapes may be in a similarity relationship. Furthermore, as illustrated in FIG. 5, one of first and second heater zone electrodes 131 and 132 (here, the second heater zone electrode 132) may be disposed to overlap with a doughnut-shaped gap G that appears between the first and second RF zone electrodes 24 and 25 when viewed in plan. In FIG. 5, the same components as those in the above-described embodiment are denoted by the same reference signs. For convenience, in FIG. 5, the connection conductors, the RF zone electrode conductors, and the power supplies for the RF zone electrodes 24 and 25 are omitted, and heater zone electrode conductors and power supplies for the heater zone electrodes 131 and 132 are also omitted. Additionally, regarding the heater zone electrodes 131 and 132, only regions where coils are wired are illustrated with omission of wiring patterns. In the case of applying larger RF power, increasing a size of the gap G is advantageous in that RF interference can be suppressed, but the larger size gap may cause a phenomenon that the plasma density reduces in a region of the gap G where the RF electrodes are not present and that the in-plane plasma density becomes non-uniform. Thus, with the arrangement in which the second heater zone electrode 132 is disposed to overlap with the region of the gap G, variations in performance of film formation attributable to the non-uniform density of the plasma can be compensated and adjusted by controlling the temperature distribution, i.e., the heater temperatures. Moreover, as illustrated in FIG. 6, in an overlapping relation to the doughnut-shaped gap G that appears between the first and second RF zone electrodes 24 and 25 when viewed in plan, a gap heater zone electrode 183 may be disposed which has a shape corresponding to the gap G (here, the same shape as the gap G). In such a case, first and second heater zone electrodes 181 and 182 have shapes substantially in match with those of the first and second RF zone electrodes 24 and 25, respectively. Thus, even if the size of the gap G between the first and second RF zone electrodes 24 and 25 is increased, for example, it is easy to separately control a temperature in the gap G by the gap heater zone electrode 183. In other words, variations in performance of film formation near the gap can be compensated and adjusted by controlling a temperature of the gap heater zone electrode 183.

While, in the above-described embodiment, the heater zone electrodes 31 and 32 are disposed on the same plane, they may be disposed at different heights (with different distances from the wafer placement surface 22a). For example, the heights of the heater zone electrodes 31 and 32 may be matched with those of the first and second RF zone electrodes 24 and 25, respectively.

Figure 7:
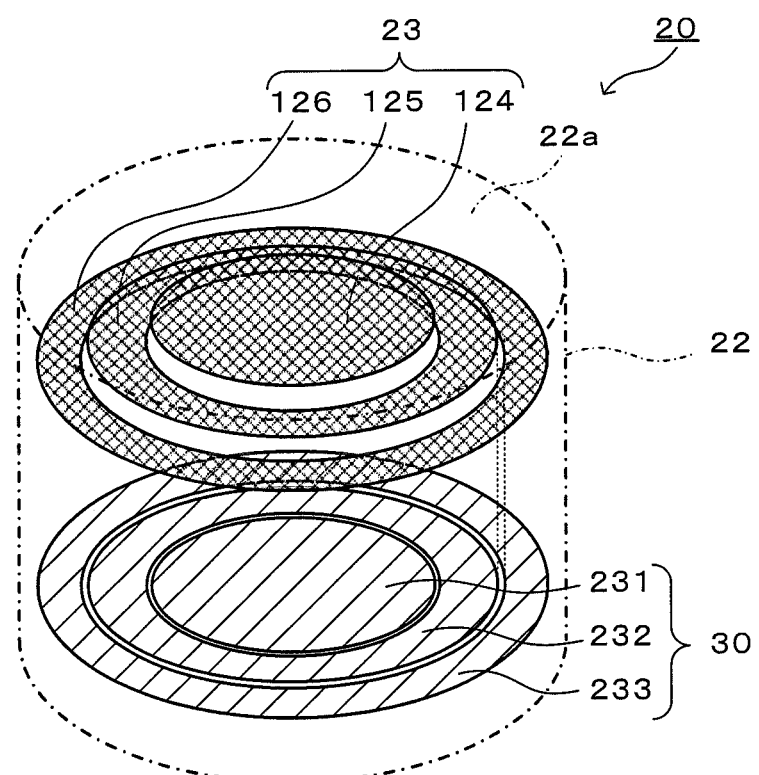
FIG. 7 is a perspective view illustrating still another arrangement of the RF electrode 23 and the heater electrode 30.

While, in the above-described embodiment, the RF electrode 23 is constituted by the first and second RF zone electrodes 24 and 25 having different heights, the RF electrode may be constituted by three or more RF zone electrodes having different heights. FIG. 7 illustrates an example in which the RF electrode 23 is constituted by first to third RF zone electrodes 124 to 126 having different heights. In FIG. 7, the same components as those in the above-described embodiment are denoted by the same reference signs. For convenience, in FIG. 7, connection conductors, RF zone electrode conductors, and power supplies for the RF zone electrodes 124 to 126 are omitted, and heater zone electrode conductors and power supplies for heater zone electrodes 231 to 233 are also omitted. Additionally, regarding the heater zone electrodes 231 to 232, only regions where coils are wired are illustrated with omission of wiring patterns. The heater zone electrodes 231 to 233 are disposed on the same plane. The first RF zone electrode 124 is a circular electrode concentric to the ceramic base 22, and the second and third RF zone electrodes 125 and 126 are each an annular electrode concentric to the ceramic base 22. The first to third RF zone electrodes 124 to 126 are arranged in order of the first RF zone electrode 124, the second RF zone electrode 125, and the third RF zone electrode 126 from the side closer to the wafer placement surface 22a. The first to third heater zone electrodes 231 to 233 constituting the heater electrode 30 are disposed in match with the first to third RF zone electrodes 124 to 126, respectively, when viewed in plan. That arrangement can also provide similar advantages to those obtained with the above-described embodiment. In particular, since different radio frequency powers can be supplied to the first to third RF zone electrodes 124 to 126, the density distribution of the plasma can be more satisfactorily controlled. Moreover, since the different powers can be supplied to the first to third heater zone electrodes 231 to 233, variations in performance of film formation among the different zones can be compensated and adjusted by controlling the heater temperatures.

Heights h1 to h3 of the first to third RF zone electrodes 124 to 126 constituting the RF electrode 23 from the heater electrode 30 can be optionally set. As illustrated in FIG. 7, for example, the above heights may be set such that the height of the first RF zone electrode 124 in a central portion from the heater electrode 30 is maximum and the height from the heater electrode 30 gradually decreases toward an outer periphery (i.e., h1>h2>h3). On the contrary, the above heights may be set such that the height of the first RF zone electrode 124 in the central portion from the heater electrode 30 is minimum and the height from the heater electrode 30 gradually increases toward the outer periphery (i.e., h1<h2<h3). As an alternative, the heights h1 to h3 of the RF zone electrodes 124 to 126 may be set as desired in relation of h1>h2<h3 or h1<h2>h3, for example.

Figure 8:
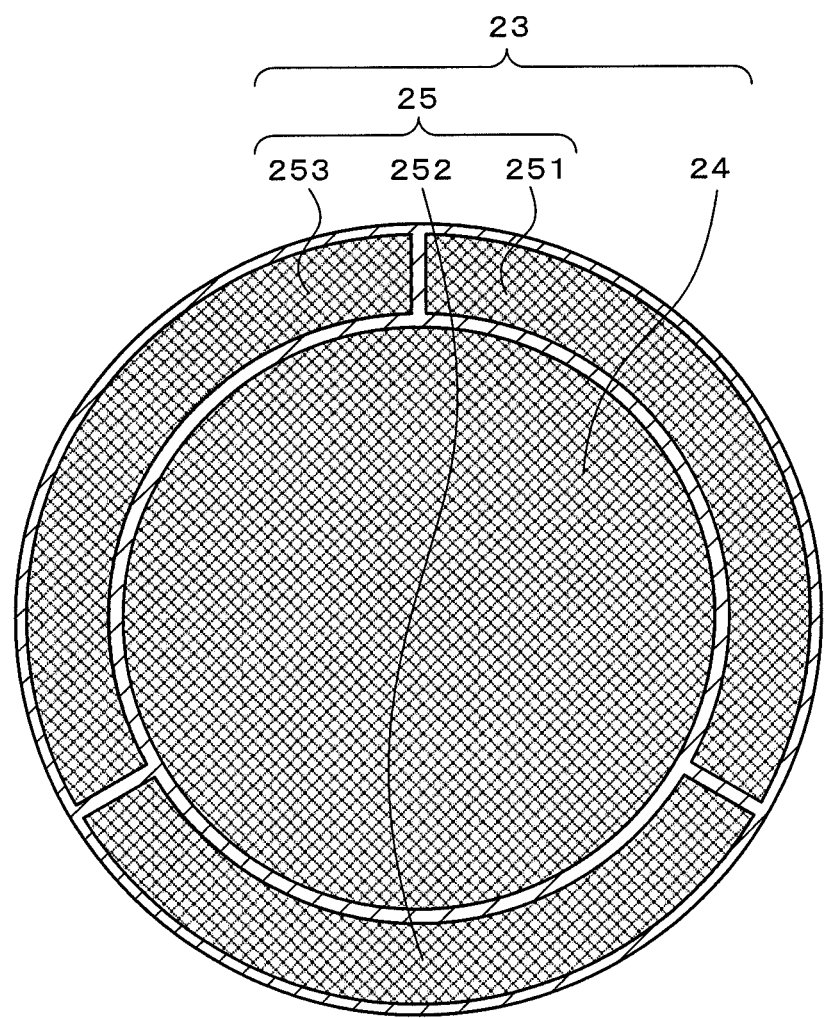
FIG. 8 is a plan view illustrating another example of the RF electrode 23.
Figure 9:
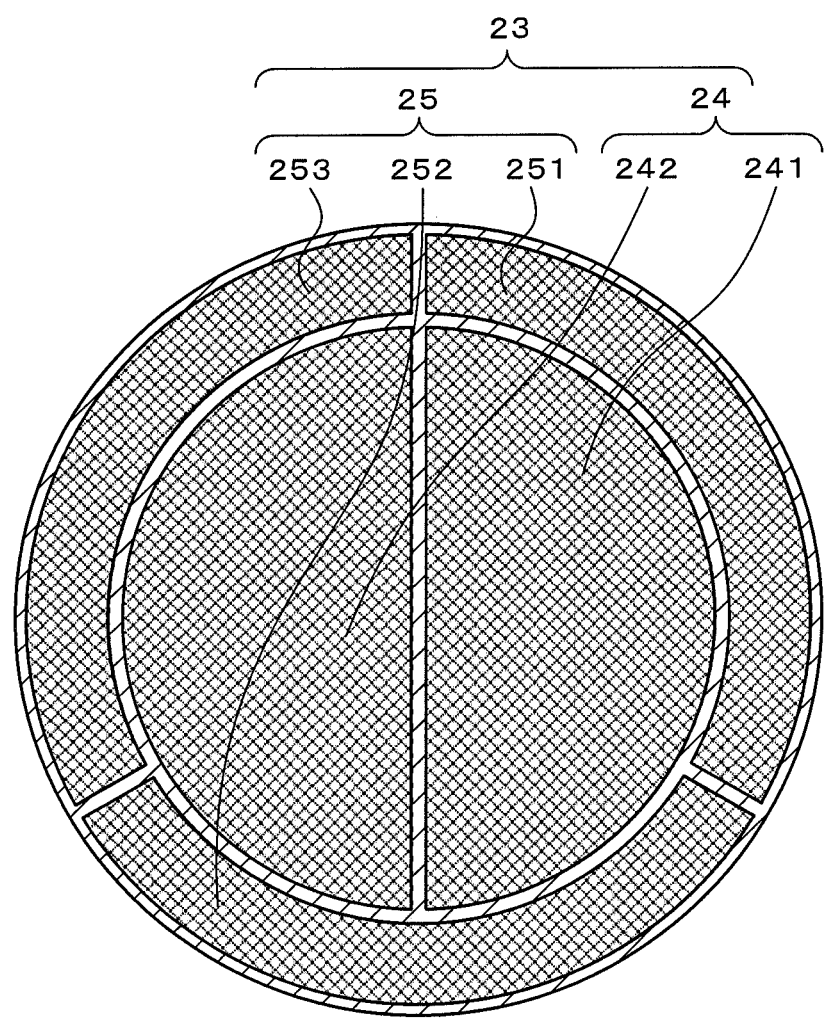
FIG. 9 is a plan view illustrating still another example of the RF electrode 23.

While, in the above-described embodiment, the RF electrode 23 is constituted by the first RF zone electrode 24 formed of the circular electrode and the second RF zone electrode 25 formed of the annular electrode, the second RF zone electrode 25 formed of the annular electrode may be divided into a plurality of electrodes, and different AC power supplies may be individually connected the divided electrodes. Furthermore, the first RF zone electrode 24 formed of the circular electrode may be divided into a plurality of electrodes, and different AC power supplies may be individually connected the divided electrodes. With such a configuration, the density distribution of the plasma can easily be controlled to be more uniform. FIG. 8 illustrates the case in which the second RF zone electrode 25 constituting the RF electrode 23 is divided into three arc-shaped electrodes 251 to 253. The three arc-shaped electrodes 251 to 253 may be positioned at the same height or different heights. Alternatively, two of the arc-shaped electrodes 251 to 253 may be positioned at the same height, and the remaining one may be positioned at a different height. FIG. 9 illustrates the case in which the second RF zone electrode 25 constituting the RF electrode 23 is divided into the three arc-shaped electrodes 251 to 253 and the first RF zone electrode 24 is divided into two semicircular electrodes 241 and 242. The semicircular electrodes 241 and 242 may be positioned at the same height or different heights.

Figure 10:
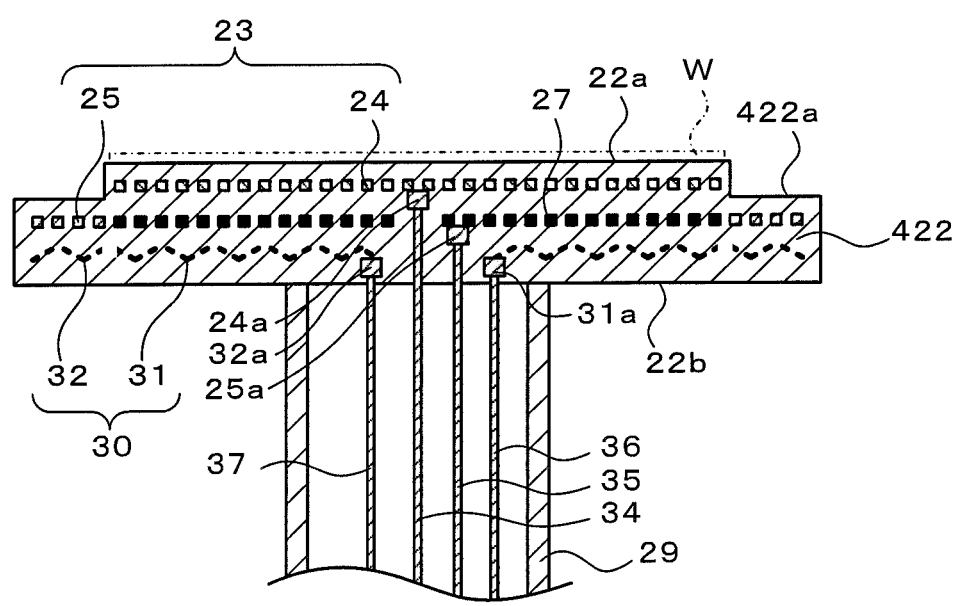
FIG. 10 is a sectional view of a wafer support including a ceramic base 422.
Figure 11:
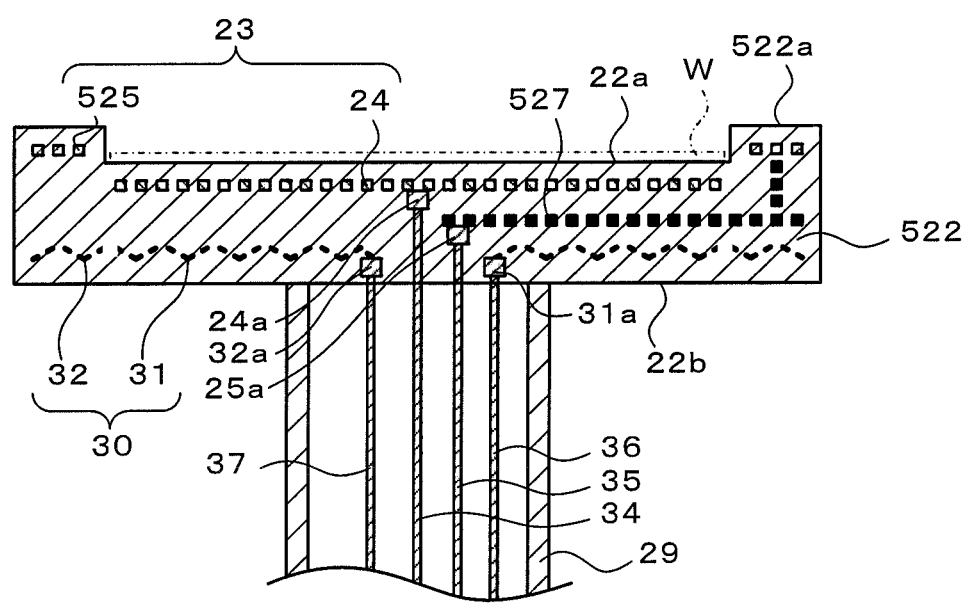
FIG. 11 is a sectional view of the wafer support including a ceramic base 522.

While the ceramic base 22 having a flat surface has been described, by way of example, in the above embodiment, a step-type ceramic base 422, illustrated in FIG. 10, may be used. In FIG. 10, the same components as those in the above-described embodiment are denoted by the same reference signs. The surface of the ceramic base 422 has an annular height-difference surface 422a in its outer peripheral portion. The height-difference surface 422a is lower than the wafer placement surface 22a by one step. In the ceramic base 422, a dielectric thickness from the first RF zone electrode (circular electrode) 24 on the inner side to the wafer placement surface 22a and a dielectric thickness from the second RF zone electrode (annular electrode) 25 on the outer side to the height-difference surface 422a may be set equal to each other. With such a configuration, the plasma density can be made more uniform between the inner and outer sides. Alternatively, a pocket-type ceramic base 522, illustrated in FIG. 11, may be used. In FIG. 11, the same components as those in the above-described embodiment are denoted by the same reference signs. The surface of the ceramic base 522 has an annular height-difference surface 522a in its outer peripheral portion. The height-difference surface 522a is higher than the wafer placement surface 22a by one step. The RF electrode 23 is constituted by the first RF zone electrode (circular electrode) 24 on the inner side and a second RF zone electrode (annular electrode) 525 on the outer side. The second RF zone electrode 525 is connected to the second AC power supply (see FIG. 2) through a connection conductor 527, the electrode terminal 25a, and the second RF zone electrode conductor 35. Furthermore, the second RF zone electrode 525 is arranged at a position higher than the first RF zone electrode 24. Also in the ceramic base 522, a dielectric thickness from the first RF zone electrode 24 to the wafer placement surface 22a and a dielectric thickness from the second RF zone electrode 525 on the outer side to the height-difference surface 522a may be set equal to each other. With such a configuration, the plasma density can be made more uniform between the inner and outer sides.

Figure 12:
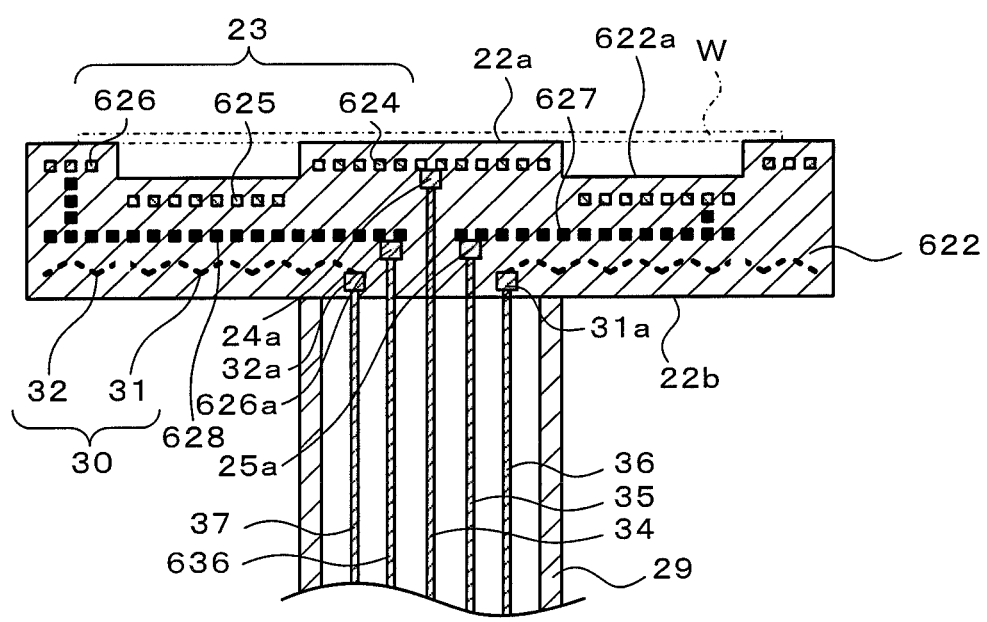
FIG. 12 is a sectional view of the wafer support including a ceramic base 622.

While FIG. 7 also illustrates, by way of example, the ceramic base 22 having a flat surface, a ceramic base 622 having an annular groove, illustrated in FIG. 12, may be used. In FIG. 12, the same components as those in the above-described embodiment are denoted by the same reference signs. An annular groove 622a concentric to the ceramic base 622 is formed in a front surface of the ceramic base 622. The RF electrode 23 is constituted by a first RF zone electrode (circular electrode) 624 on the inner side, a second RF zone electrode (annular electrode) 625 on the outer side, and a third RF zone electrode (annular electrode) 626 on the outer side of the second RF zone electrode 625. The second RF zone electrode 625 is connected to the second AC power supply 45 (see FIG. 2) through a connection conductor 627, the electrode terminal 25a, and the second RF zone electrode conductor 35. The third RF zone electrode 626 is connected to a third AC power supply (not illustrated) through a connection conductor 628, an electrode terminal 626a, and a third RF zone electrode conductor 636. A dielectric thickness from the first RF zone electrode 24 to the wafer placement surface 22a, a dielectric thickness from the second RF zone electrode 625 to a bottom surface of the annular groove 622a, and a dielectric thickness from the third RF zone electrode 626 to the wafer placement surface 22a may be set equal to one another. With such a configuration, the plasma density can be made more uniform between the inner and outer sides.

While the division number of the RF electrode 23 is equal to that of the heater electrode 30 in the above-described embodiment and the form illustrated in FIG. 7, the division number may be different between the RF electrode 23 and the heater electrode 30.

While, in the above-described embodiment, the first and second RF zone electrodes 24 and 25 and the connection conductor 27 are each constituted by the conductive mesh sheet, materials of those members are not limited to the mesh sheet for a specific reason, and a uniform conductive sheet (such as a metal foil), for example, may also be used instead.

In the above-described embodiment, the wafer W may be attracted to the wafer placement surface 22a by applying a voltage to the RF electrode 23. Alternatively, an electrostatic electrode may be embedded in the ceramic base 22, and the wafer W may be attracted to the wafer placement surface 22a by applying a voltage to the electrostatic electrode.

While one example of a method for manufacturing the wafer support 20 has been described in the above embodiment, methods for manufacturing the wafer support 20 are not limited to the above-described example for a specific reason, and the wafer support 20 may be manufactured in accordance with suitable one of the other known methods. The wafer support 20 may be manufactured in accordance with the manufacturing method disclosed in Japanese Unexamined Patent Application Publication No. 2012-89694, for example.

This application claims priority based on Japanese Patent Application No. 2018-127620 filed on Jul. 4, 2018, the entire contents of which are incorporated herein by reference.

What is claimed is:
1. A wafer support including an RF electrode and a heater electrode that are embedded inside a disk-shaped ceramic base having a wafer placement surface,
wherein the RF electrode is constituted by a plurality of RF zone electrodes that are individually disposed for each of a plurality of divided zones of the wafer placement surface,
the plurality of RF zone electrodes are separately disposed in at least two stag that are positioned at different distances from the wafer placement surface,
the heater electrode is constituted by a plurality of heater zone electrodes that are individually disposed for each of a plurality of divided zones of the wafer placement surface, the zones being divided in a similar or different way to or from th RF zone electrodes,
the plurality of RF zone electrodes are independently connected to a plurality of RF zone electrode conductors through electrode terminals disposed on a rear surface of the ceramic base, and the plurality of heater zone electrodes are independently connected to a plurality of heater zone electrode conductors through electrode terminals disposed or the rear surface of the ceramic base, wherein thicknesses of the ceramic base in regions above the RF zone electrodes are equal to each other.

2. The wafer support according to claim 1, wherein the RF electrode includes, as the plurality of RF zone electrodes, a circular electrode concentric to the ceramic base or a plurality of divided electrodes of the circular electrode, and further includes, outside the circular electrode or the plurality of divided electrodes of the circular electrode, one or more annular electrodes concentric to the ceramic base or a plurality of divided electrodes of at least one of the annular electrodes.

3. The wafer support according to claim 1, wherein at least one of the heater zone electrodes is arranged in a gap between the RF zone electrodes when the ceramic base is viewed from a side facing the wafer placement surface.

4. The wafer support according to claim 3, wherein the heater zone electrode arranged in the gap is a gap heater zone electrode having a similar shape to a shape of the gap.

5. The wafer support according to claim 1, wherein shapes of the plurality of RF zone electrodes and shapes of the plurality of heater zone electrodes are in match with each other when the ceramic base is viewed from a side facing the wafer placement surface.

6. The wafer support according to claim 1, wherein the plurality of RF zone electrodes include a circular electrode concentric to the ceramic base and one or more annular electrodes concentric to the ceramic base, the annular electrodes being positioned outside the circular electrode, the plurality of heater zone electrodes constituting the heater electrode are disposed on the same plane, and heights of the plurality of RF zone electrodes from the heater electrode are set such that the height of the RF zone electrode positioned closer to a center of the ceramic base is higher.

7. The wafer support according to claim 1, wherein the plurality of RF zone electrodes include a circular electrode concentric to the ceramic base and one or more annular electrodes concentric to the ceramic base, the annular electrodes being positioned outside the circular electrode, the plurality of heater zone electrodes constituting the heater electrode are disposed on the same plane, and heights of the plurality of RF zone electrodes from the heater electrode are set such that the height of the RF zone electrode positioned closer to a center of the ceramic base is lower.

8. The wafer support according to claim 1, further including a hollow ceramic shaft bonded to a central region of a surface of the ceramic base on a side opposite to the wafer placement surface, wherein the RF zone electrode conductors and the heater zone electrode conductors are disposed inside the ceramic shaft.

* * * * *